(12) United States Patent
Yamagishi et al.

(10) Patent No.: US 7,789,240 B2
(45) Date of Patent: Sep. 7, 2010

(54) SUBSTRATE CONTAINER AND HANDLE THEREOF

(75) Inventors: Hiroki Yamagishi, Saitama (JP); Yoshiaki Fujimori, Saitama (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 30 days.

(21) Appl. No.: 12/104,214

(22) Filed: Apr. 16, 2008

(65) Prior Publication Data

US 2008/0251415 A1 Oct. 16, 2008

(30) Foreign Application Priority Data

Apr. 16, 2007 (JP) ............... 2007-107383

(51) Int. Cl.
*B65D 85/00* (2006.01)
(52) U.S. Cl. ..................................... 206/710
(58) Field of Classification Search ................ 206/710, 206/701, 711; 16/421, 422, 425; 220/759, 220/768, 769, 772, 752
See application file for complete search history.

(56) References Cited

U.S. PATENT DOCUMENTS

| | | | | |
|---|---|---|---|---|
| 2,044,388 | A * | 6/1936 | Gundelfinger | 220/759 |
| 5,788,082 | A * | 8/1998 | Nyseth | 206/711 |
| 6,010,008 | A | 1/2000 | Nyseth et al. | |
| 6,382,419 | B1 | 5/2002 | Fujimori et al. | |
| 6,398,033 | B1 * | 6/2002 | Wu et al. | 206/711 |
| 6,736,268 | B2 | 5/2004 | Nyseth et al. | |
| 6,923,325 | B2 * | 8/2005 | Duban-Hu et al. | 206/711 |
| 6,993,809 | B2 * | 2/2006 | Chin-Kang | 206/710 |
| 7,216,766 | B2 | 5/2007 | Matsutori et al. | |
| 7,347,329 | B2 * | 3/2008 | Burns et al. | 206/711 |
| 2004/0124118 | A1 | 7/2004 | Matsutori et al. | |
| 2006/0081498 | A1 * | 4/2006 | Obayashi | 206/710 |
| 2008/0006559 | A1 | 1/2008 | Fuller et al. | |

FOREIGN PATENT DOCUMENTS

| | | |
|---|---|---|
| JP | 2000-306988 | 11/2000 |
| JP | 2005-252278 | 9/2002 |
| WO | 2005/041267 A2 | 5/2005 |

OTHER PUBLICATIONS

Patent Abstracts of Japan for Japanese Publication No. 2000306988, Publication date Nov. 2, 2000 (1 page).
Patent Abstracts of Japan for Japanese Publication No. 2002252278, Publication date Sep. 6, 2002 (1 page).

* cited by examiner

*Primary Examiner*—Ehud Gartenberg
*Assistant Examiner*—Andrew Perreault
(74) *Attorney, Agent, or Firm*—Osha • Liang LLP

(57) ABSTRACT

A substrate container includes: a container main body including an opening and containing a substrate; a lid body closing the opening; and a pair of handles provided on a pair of opposing side walls of the container main body, and the handle is secured to an edge portion of the side wall.

4 Claims, 13 Drawing Sheets

SUBSTRATE CONTAINER AND HANDLE THEREOF

BACKGROUND OF THE INVENTION

1. Field of the Invention

The present invention relates to a substrate container that contains substrates such as a semi-conductor wafer, a mask glass, a mask glass with a pellicle or a pellicle, and a handle to be attached thereto.

2. Related Background of the Invention

As a substrate container for use in transportation of a substrate, for example a substrate container that is disclosed in Patent Document 1 (Japanese Patent Application Laid-Open No. 2000-306988) has been known. This substrate container is provided with a container main body in which front part an opening is formed and which contains a substrate inside, and a lid body that closes the opening of the container main body. Inside the side wall of the container main body of such a substrate container, there is formed a support that horizontally supports substrates at regular intervals. In addition, at the central portion of an external surface of the side wall of the container main body, a handle (grip) is attached. Thus, by an operator holding this handle, the substrate container is easily lifted, and the substrate container can be easily carried.

SUMMARY OF THE INVENTION

In the conventional technique described in the above-mentioned Patent Document 1, however, the handle is fixed to the vicinity of central portion of the side wall of the container main body, so that when an operator grips the handle and carries the substrate container, the side wall is likely to deform due to the load of the substrate container. Owing to the deformation of the side wall, there is generated a friction between the container main body and the substrates in the container main body, and thus a problem exists in the increase of particles to adversely affect the substrates. Furthermore, due to the deformation of the side wall, a further problem exists in reduction of a positional accuracy in the container main body.

The present invention has been made to solve such problems, and has an object of providing a substrate container which can reduce the deformation of the container main body and suppress the friction between the substrates in the container main body and the container main body to prevent the generation of particles, as well as holding the substrates with high positional accuracy, and a handle thereof.

The present invention is a substrate container comprising: a container main body including an opening and containing a substrate; a lid body closing the opening; and a pair of handles provided on a pair of opposing side walls of the container main body, wherein the handle is secured to an edge portion of the side wall.

According to such a substrate container, the handle is secured to the edge portion of the side wall of the container main body. The edge portion of the side wall of the container main body forms a ridge portion with a top plate or bottom plate of the container main body, and exhibits a higher rigidity than that of the side wall surface to be unlikely to deform. Thus, due to provision of the positions to which the handle is secured at the edge portions of the side wall, the possibility of deformation of the container main body can be reduced compared with conventional cases. Whereby, generation of the friction between the container main body and the substrate in the container main body can be prevented, and thus generation of particles can be suppressed. Furthermore, due to that the deformation of the container main body is reduced, the substrate in the container main body can be held with high positional accuracy. In addition, due to that the positions to which the handle is secured are located at the edge portions opposed to each other on the side wall, when an operator lifts up the substrate container, it can be held with high stability. Incidentally, "edge portion" is the portion to include the edge and the vicinity thereof.

Moreover, preferably, the handle is secured to the edge portions opposed to each other on the side wall. As a result, due to that the positions to which the handle is secured are provided at the edge portions opposed to each other on the side wall, the deformation of the container main body can be reduced further.

In addition, preferably, the handle comprises a grip to be gripped by an operator; and an engaging portion which is formed continuously from both end portions of the grip, and which can be engaged with an engaged portion formed at the edge portion of the side wall.

Furthermore, preferably, a longitudinal center of the grip is located further to the opening side than the center of gravity of the container main body. As a result, when an operator grips the grip and lifts up the substrate container, due to that the center of gravity of the container main body is located further to the rear than the center of the grip, the substrate container can be held with high stability. In addition, due to that the opening side of the container main body is likely to face upward, the possibility that the substrate in the container main body drops down from the opening is reduced.

Furthermore, preferably, one of the engaging portion and the engaged portion is provided with an engaging pawl, and the other is formed with an engaging hole with which the engaging pawl is engaged. As a result, due to that the engaging pawl is made to engage with the engaging hole, the handle can be reliably secured to the container main body. Incidentally, "engaging hole" includes a through hole and a concavity, and the shape thereof is not limited. The engaging hole has only to be capable of engaging the engaging pawl.

In addition, preferably, the handle includes a grip portion that is fixed along an edge portion of the side wall, and that protrudes outward from the edge portion. As a result, the handle can be formed to be of simple structure, and thus the deformation of the container main body can be reduced.

The present invention is a handle of a substrate container that is attached to a side wall of a container main body of a substrate container including an opening and containing a substrate, the handle comprising: a grip to be gripped by an operator; and an engaging portion which is connected to both end portions of the grip, and which can be engaged with an engaged portion formed at the edge portions opposed to each other on the side wall.

According to such a handle of a substrate container, it is constructed to be capable of being attached to the edge portions opposed to each other on the side wall of the container main body. The edge portion of the side wall of the container main body exhibits a higher rigidity than that of the side wall surface, and is unlikely to deform. Thus, owing to the construction in which the handle can be secured to the edge portions of the side wall, in use with the handle secured to the container main body, the deformation of the container main body can be reduced. Whereby generation of the friction between the container main body and the substrate in the container main body can be prevented, and thus generation of particles can be suppressed. Furthermore, due to that the deformation of the container main body is reduced, the substrate in the container main body can be held with high positional accuracy. In addition, due to the construction in which the handle can be secured to the edge portions opposed to each other on the side wall, in use with the handle secured to the container main body, an operator can hold the substrate container with high stability. Incidentally, "edge portion" is the portion to include the edge and the vicinity thereof.

According to the substrate container and the handle thereof of the present invention, due to that the deformation of the container main body can be reduced, the friction between the substrate in the container main body and the container main body is suppressed to prevent the generation of particles, as well as the substrate can be held with high positional accuracy.

The present invention will become more apparent from the following detailed description of the present invention when taken in conjunction with the accompanying drawings. The following examples are given for illustrative purposes only and are not meant to be a limitation on the subject invention.

DETAILED DESCRIPTION OF THE PREFERRED EMBODIMENTS

Figure 1:
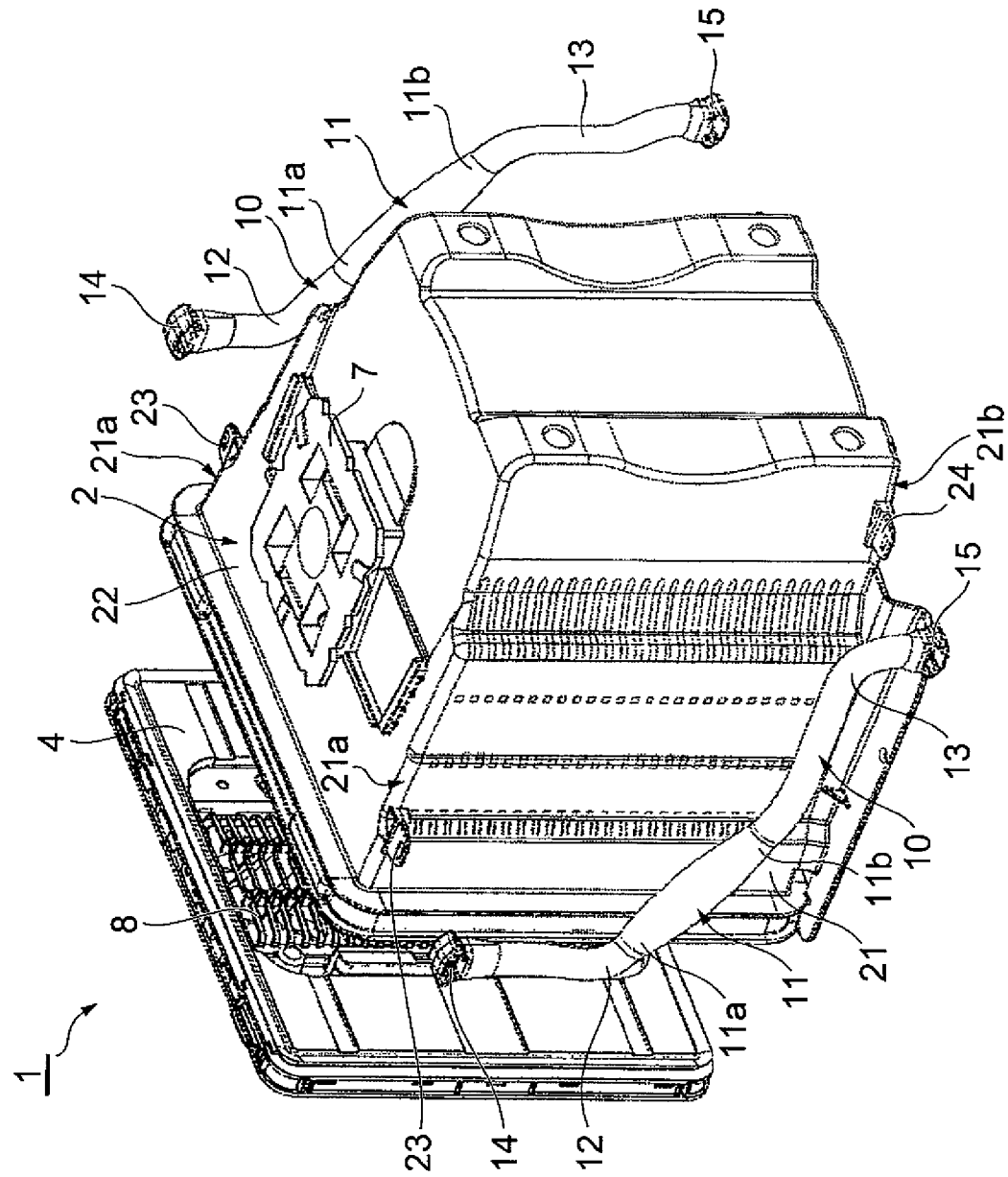
FIG. 1 is an exploded perspective view illustrating from a back side a substrate container according to an embodiment of the present invention.
Figure 2:
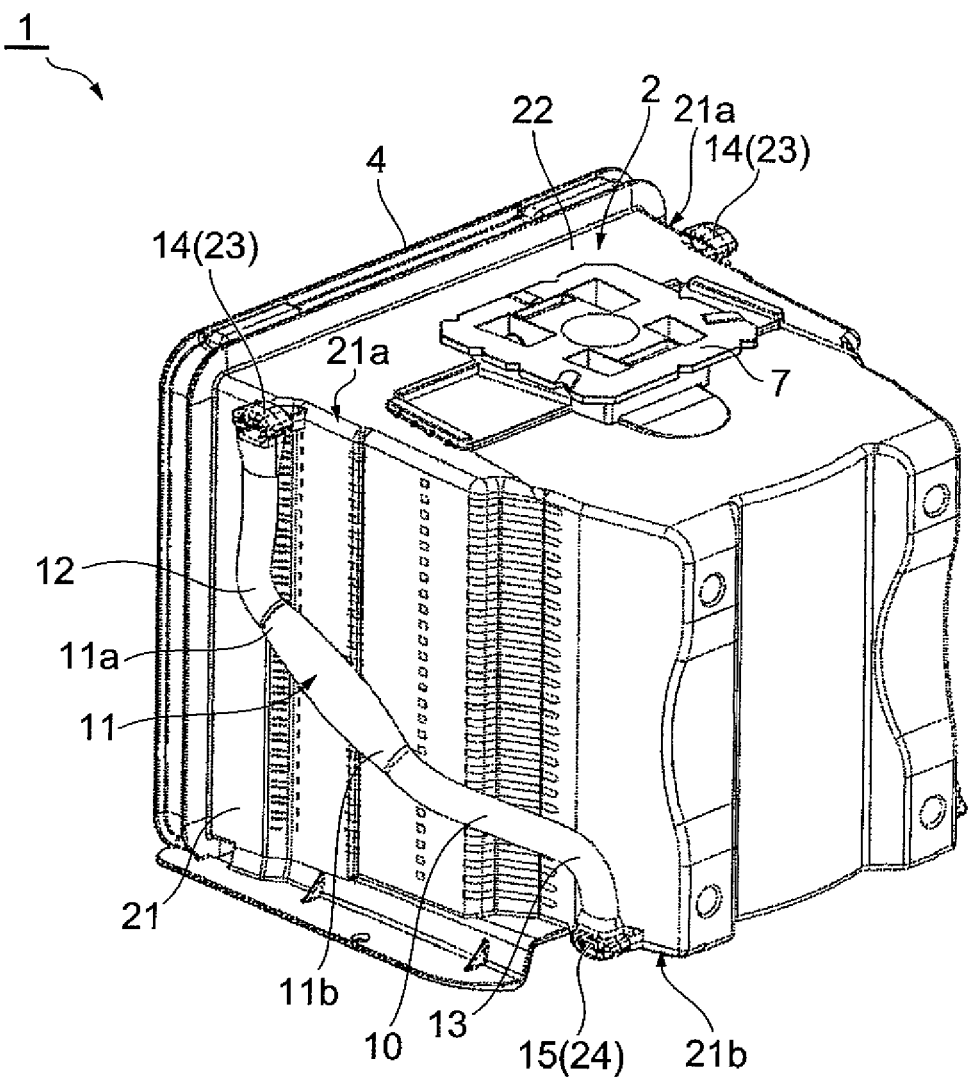
FIG. 2 is a perspective view illustrating from the back side the substrate container according to the embodiment of the present invention.
Figure 3:
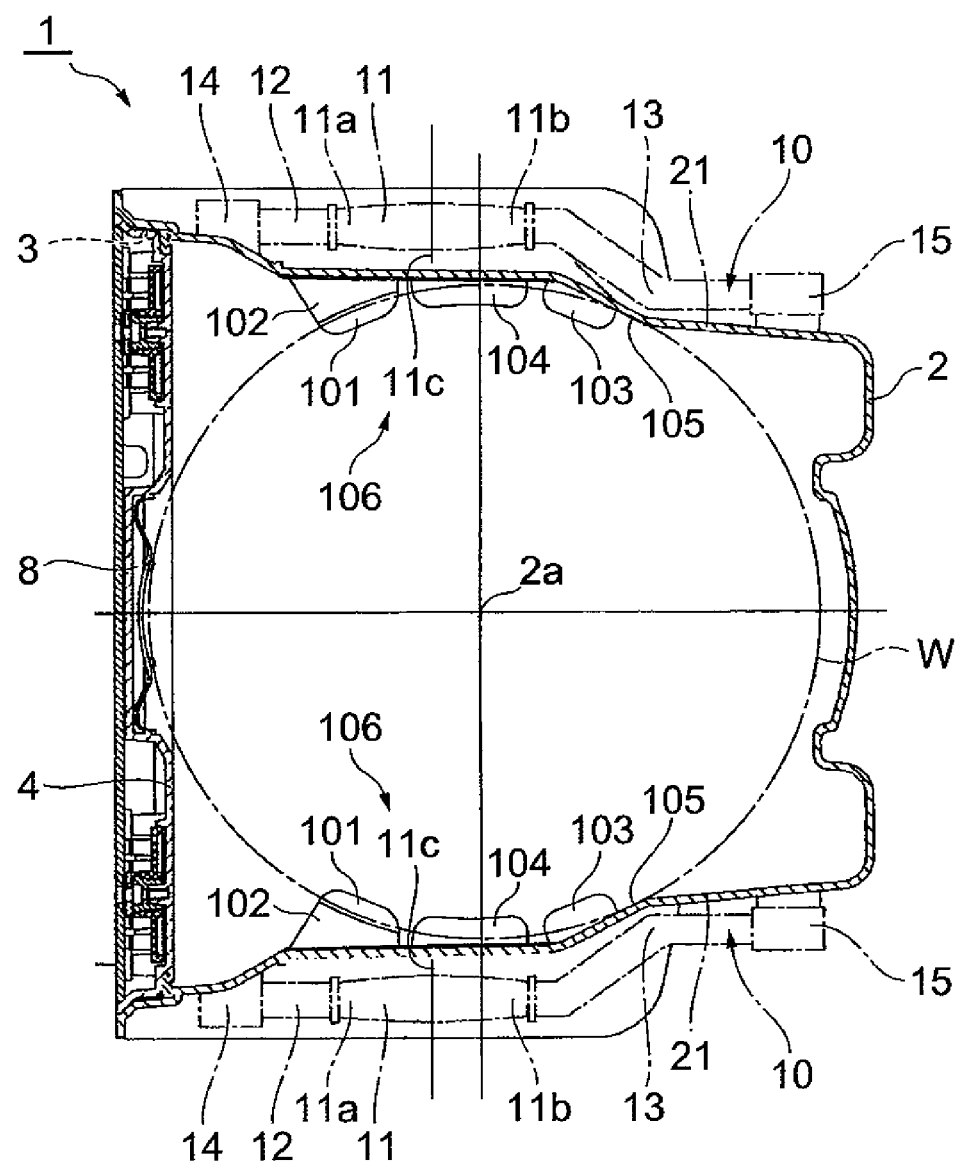
FIG. 3 is a cross sectional view of the substrate container according to the embodiment of the present invention.

Hereinafter, a preferred embodiment of a substrate container and a handle thereof according to the present invention will be described referring to the drawings. Incidentally, in descriptions of the drawings, like reference numerals refer to the same or corresponding elements, and repeated descriptions will be omitted. FIG. 1 is an exploded perspective view illustrating a substrate container according to this embodiment of the present invention from the back side. FIG. 2 is a perspective view illustrating the substrate container according to this embodiment of the present invention from the back side. FIG. 3 is a cross sectional view of the substrate container according to this embodiment of the present invention.

A substrate container 1 illustrated in FIGS. 1 to 3, is a container for use in containing, transporting, carrying and storing one or plural numbers (for example, 6, 13 or 25 pieces) of substrates W. This substrate container 1 is provided with a container main body 2 containing the substrates W, and a lid body 4 closing an opening 3 that is formed in this container main body 2. The container main body 2 is constructed to be capable of containing the substrates W in alignment. At the lid body 4, there is provided an engagement mechanism to be engaged with a pair of opposing edges of the opening 3 of the container main body 2. The lid body 4 is mounted on the opening 3 of the container main body 2, and the substrate container 1 is made fully enclosed. Moreover, on the back side of the lid body 4 (on an inner side of the substrate container), there is attached a retainer 8 that horizontally supports a plurality of the substrates W in alignment vertically.

Among parts of the substrate container 1, the container main body 2, the lid body 4, a positioning part (not illustrated), a robotic flange 7 and a handle 10 are made of, for example, thermoplastic resins or alloys thereof. Examples of these thermoplastic resins include polycarbonate, cycloolefin polymers, polyetherimide, polyethersulfone, polyetherketone, polybutyleneterephthalate, polyether ether ketone, liquid crystal polymers, and annular olefin resins. Further, conductive agents or various antistatic agents may be added to thermoplastic resins. Examples of conductive agents include carbon black, acetylene black, carbon fibers, carbon nanotubes, metal fibers, metal oxides, and conductive polymers. Examples of antistatic agents include anionic, cationic, nonionic antistatic agents.

Furthermore, ultraviolet absorbers may be added to thermoplastic resins. Examples of ultraviolet absorbers include benzotriazol, salicylate, cyanoacrylate, oxalic acid anilide, hindered amine ultraviolet absorbers. In addition, additives for increasing rigidity may be added to thermoplastic resins. Examples of these additives include glass fibers or carbon fibers.

Moreover, the substrate container 1 may be formed of ceramics or metal materials such as duralumin or titanium alloys. As a result, weight saving of the substrate container 1 may be achieved.

The substrates to be contained in the substrate container 1 are made of, for example, disc-shaped silicon wafers of a diameter of 300 mm, and both sides thereof are subjected to mirror surface finishing. The substrate W is put in or taken out of the container main body 2 in the state in which the circumferential edges at left and right side portions are handled by a dedicated robot. At the circumferential edge of the substrate W, there are formed notches making it easy to determine a crystal direction thereof or to arrange the substrates W. These notches are shaped to be, for example, semi-circular in a plan view.

The container main body 2 is molded using a predetermined resin such as polycarbonate having high transparency or high rigidity. The container main body 2 is of front-open box type in which the front is open, and both side walls 21 of the container main body 2 are formed with respective teeth 106 that horizontally support the substrate W. A plurality of these teeth 106 is arranged at a predetermined pitch vertically in the drawing. Further, with these teeth 106, the substrates W are arranged and contained in alignment vertically in a horizontal state.

Each teeth 106 has only to be of construction in which the substrates W can be supported, and the shape thereof is not limited. Examples of the shape of the teeth 106 include a rectangular shape, a dogleg shape or a semi-circular shape. The teeth 106 is provided with a ledge portion that is formed so as to be in conformity with the circumferential edge of the substrate W, and a substrate contact portion 101, 103 having a flat face to be contacted with the substrate W. Here, the ledge portion and the substrate contact portion, as illustrated in FIG. 3, can be provided to be split into the one on the side of opening 3 and the one on the back side, and at an intermediate portion therebetween, an auxiliary support portion 104 that is normally in no contact with the substrate W can be provided. The auxiliary support portion 104 is provided in a position lower than the substrate contact portions 101 and 103, to prevent the substrate W from being inserted into an adjacent substrate contact portion 101 (cross-slotted) when inserting the substrate W.

Furthermore, on the side of opening 3 of the teeth 106, there is formed a position regulating step 102 to regulate the position of the substrate W. With this position regulating step 102 and a wall surface portion 105 of the substrate contact portion 103 that is formed in conformity with the shape of the substrate W on the interior side (on the side opposite to the opening) of the container main body 2, the movement in front-back direction of the substrate W in the container main body 2 can be regulated (incidentally, the front side is referred to as front, and the back side is referred to as back). Furthermore, it is also preferable that no auxiliary support portion 104 according to the above-mentioned embodiment is provided, and that there are provided only at two points the substrate contact portion on the side of opening 3 and the substrate contact portion on the back side and there is formed a space at the intermediate portion therebetween.

Figure 13:
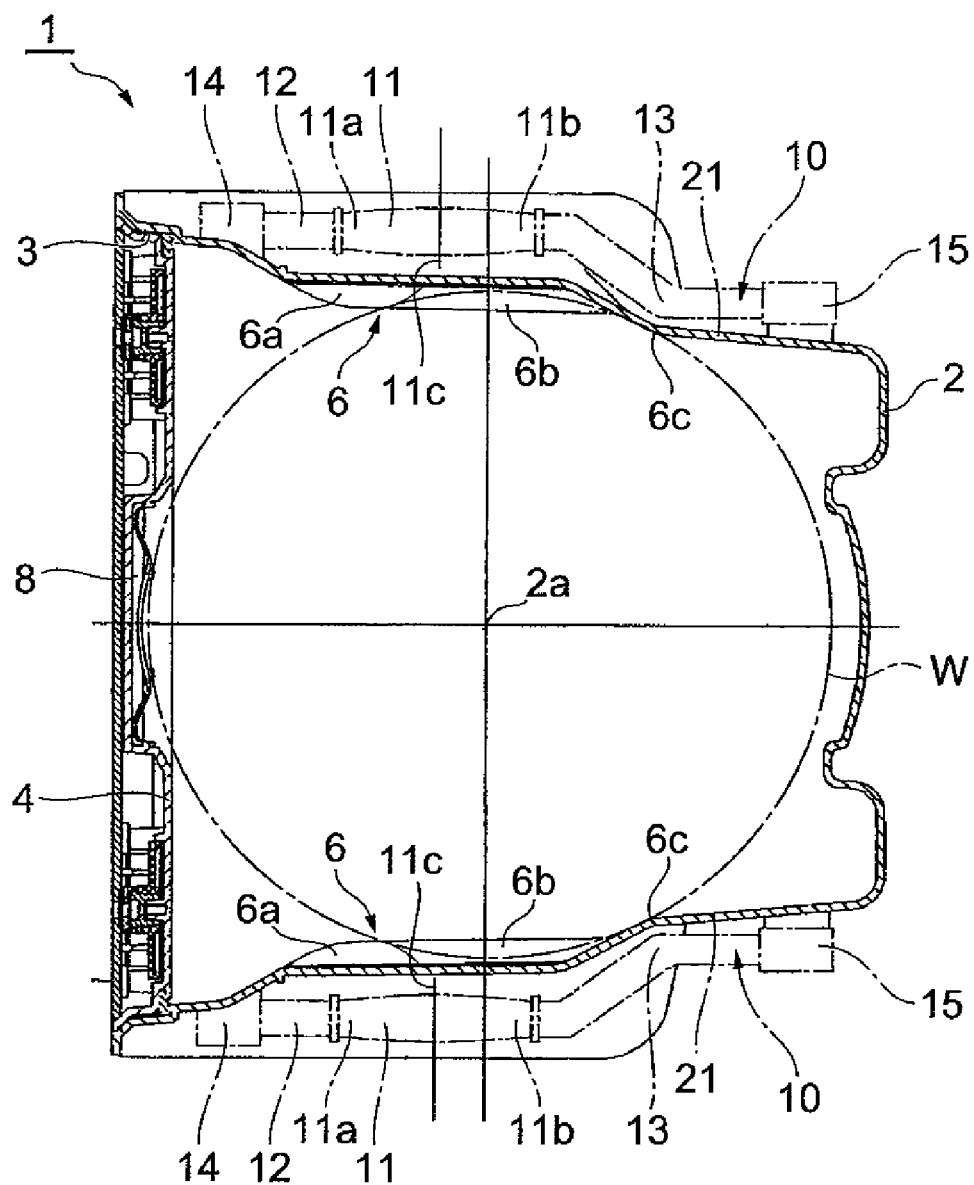
FIG. 13 is a cross sectional view illustrating another example of a teeth.

The teeth 106 of such a construction may be formed as a part separate from the container main body 2 and inserted when the container main body 2 is molded to be provided integrally with the container main body, or may be secured using heat-welding, frictional engagement or with threaded parts. FIG. 13 is a cross sectional view illustrating another example of a teeth. As illustrated in FIG. 13, a teeth 6, in a plan view, may be formed to be integral with the container main body 2 so as to be a ledge portion that is continuous from the opening, in a rectangular shape which back side is bent in a dogleg shape. Also in this case, the ledge portion includes a substrate contact portion 6b and regions 6a and 6c making a positional regulation in front-back direction of the substrate, thus enabling to horizontally support the substrate. With such teeth 6, 106, the substrates W, in an internal part of the container main body 2, are positioned and supported with high accuracy. Therefore, a vertical inclination of the substrate W is prevented, and a fork for taking out the substrate W can be easily inserted into the container main body 2.

On an external surface of a bottom plate (bottom) of the container main body 2, there is formed a positioning portion for making positioning with respect to a predetermined apparatus (for example, a processing equipment of processing the substrate). The positioning portion is provided at three points, and formed to be in Y shape. In addition, in the positioning portion, a V-shaped groove (concavity) is formed. Moreover, the sectional shape of the positioning portion is not limited to V shape, but is, for example, M shape, an inverted V shape, inverted Y shape, or concave oval shape.

On the external surface of a top plate 22 of the container main body 2, there is formed a robotic flange 7 shaped to be rectangular in a plan view. This robotic flange 7 may be formed integrally with the container main body 2, or may be constructed to be formed as a separate part to be detachable with respect to the container main body 2. The substrate container 1, with the robotic flange 7 held by an automatic transport mechanism, not illustrated, that is referred to as OHT (overhead hoist transfer), is carried in a factory.

Here, the substrate container 1 is provided with a pair of handles 10 that is provided on a pair of opposing side walls 21 and 21 of the container main body 2, and these handles 10 are secured to the edge portions of the side walls 21 of the container main body 2. In specific, these handles 10 are secured detachably to corner portions (ridge line portions) 21a and 21b, being opposing edge portions of the side wall 21. As the position to which the handle 10 is secured, there are provided at the corner portions 21a and 21b engaged portions 23 and 24 for engaging the handle 10.

Furthermore, the positions of the side wall 21 to which the handle 10 is secured are preferably located at the corner portions 21a and 21b that are opposed to each other with the central portion of the side wall 21 sandwiched. For example, more preferably, the handle 10 is located so as to be along the diagonal line of the side wall 21, and the positions to which the handle 10 is secured are located diagonally on the side wall 21. In addition, the pair of handles secured to both side walls 21 is preferably arranged in a symmetrical manner.

The handle 10 is provided with a grip 11 to be gripped by an operator, curved portions 12 and 13 that are formed continuously in opposite directions to each other from both end portions 11a and 11b of this grip 11, and engaging portions 14 and 15 that are provided at the ends of the curved portions 12 and 13, and can engage with the engaged portions 23 and 24.

The grip 11 may be, for example, of a rod shape of a constant thickness, or may of a rod shape having different thicknesses so as to be the thickest at the outer circumference in a longitudinal center 11c. That is, the grip 11 is preferably of shape that is easy to be ergonomically gripped. Furthermore, at both of the longitudinal end portions 11a and 11b of the grip 11, a flange or a rib protruding outward may be provided. The grip 11, in the state in which the handle 10 is attached to the container main body 2, is preferably located to be longitudinally inclined. Specifically, the grip is disposed with the end portion 11a on the front side of the grip 11 facing upward, and the end portion 11b on the rear side of the grip 11 facing downward.

The curved portion 12 is curved upward from the end portion 11a of the grip 11, and the curved portion 13 is curved horizontally from the end portion 11b of the grip 11 and curved downward on the rear side thereof as well as curved inward (to the side wall 21 of the container main body 2). The grip 11, in the state in which the handle 10 is attached to the container main body 2, is located a predetermined distance spaced apart from the side wall 21, to be located in the position in which an operator can easily grip it.

Figure 4:
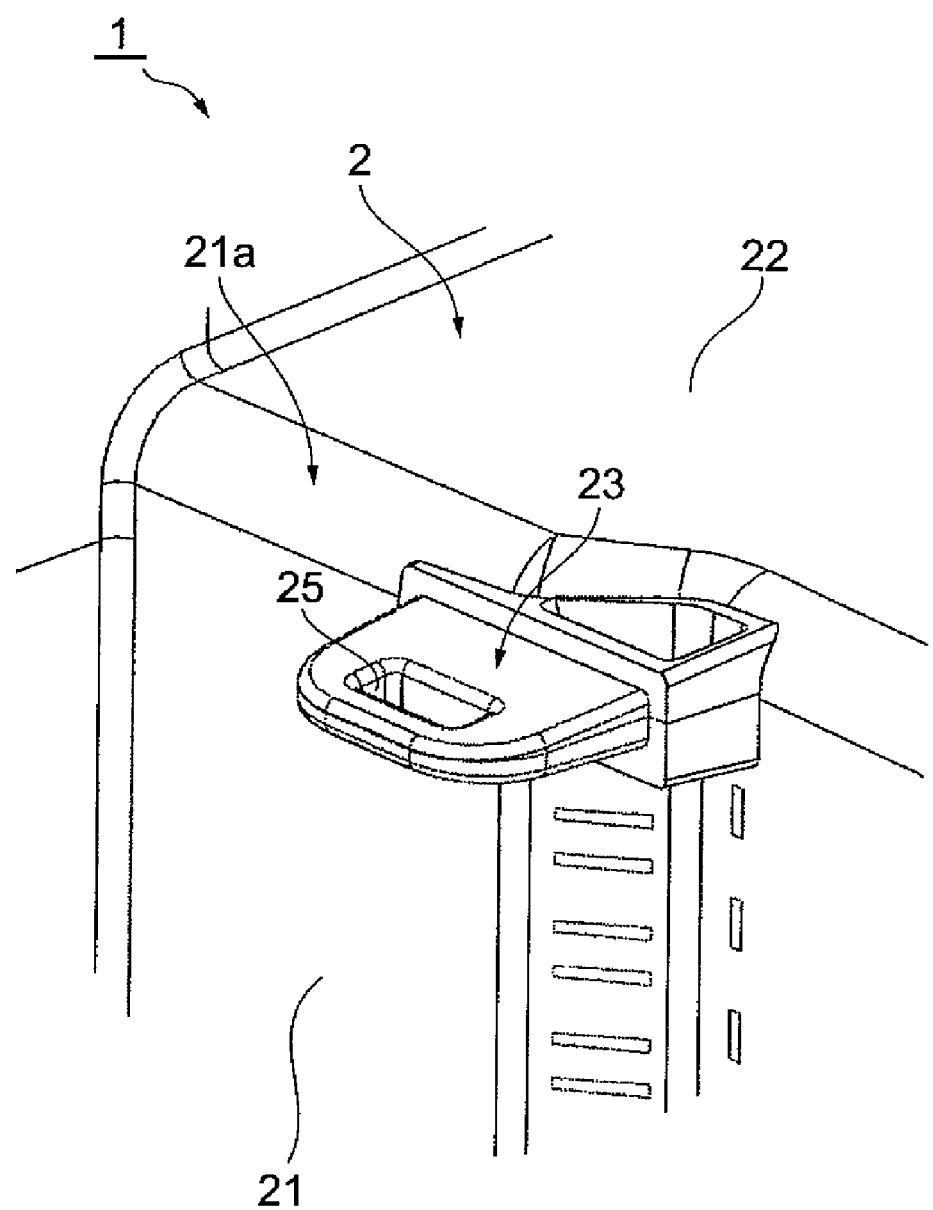
FIG. 4 is a perspective view illustrating in an enlarged manner an engaged portion in FIG. 1.
Figure 8:
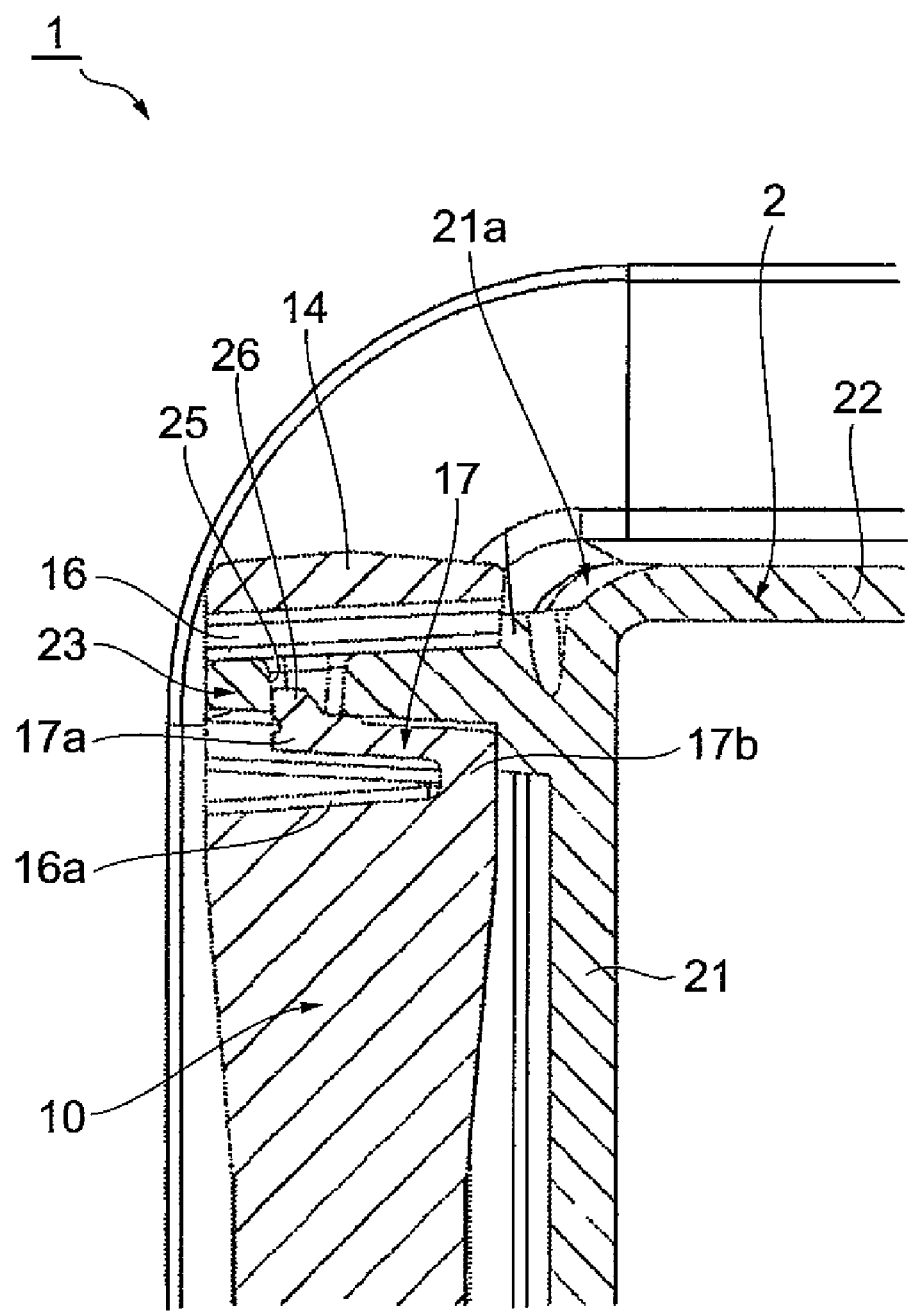
FIG. 8 is a longitudinally sectional view illustrating the engagement state between the engaging portion and the engaged portion.

FIG. 4 is a perspective view illustrating in an enlarged manner the engaged portion in FIG. 1. Incidentally, although in FIG. 4, the engaged portion 23 is illustrated, the engaged portion 24 is of the same construction. The engaged portion 23 is located at the corner portion 21a between the side wall 21 and the top plate 22 of the container main body 2, and the engaged portion 24 is located at the corner portion 21b between the side wall 21 and the bottom plate of the container main body 2. The engaged portions 23 and 24 are formed to be plate-like and to protrude outward from the container main body 2, and formed with an engaging hole 25 acting to engage an engaging pawl 26 (refer to FIG. 5) of the engaging portions 14 and 15. Furthermore, the sizes of diameter of the engaging hole 25 are different vertically. As illustrated in FIG. 8, at the engaged portion 23, the diameter on the lower portion side is made smaller than that on the upper portion side, and the engaging pawl 26 is inserted from the lower portion side of the engaged portion 23 to be engaged with an inner wall surface of the engaging hole 25. Incidentally, although not illustrated, the engaged portion 24 is shaped to be vertically inverted from the engaged portion 23. At the engaged portion 23, the diameter on the upper portion side is made smaller than that on the lower portion side, and the engaging pawl 26 of the engaging portion 15 is inserted from the upper portion side of the engaged portion 24 to be engaged with an inner wall surface of the engaging hole 25 of the engaged portion 24.

Figure 5:
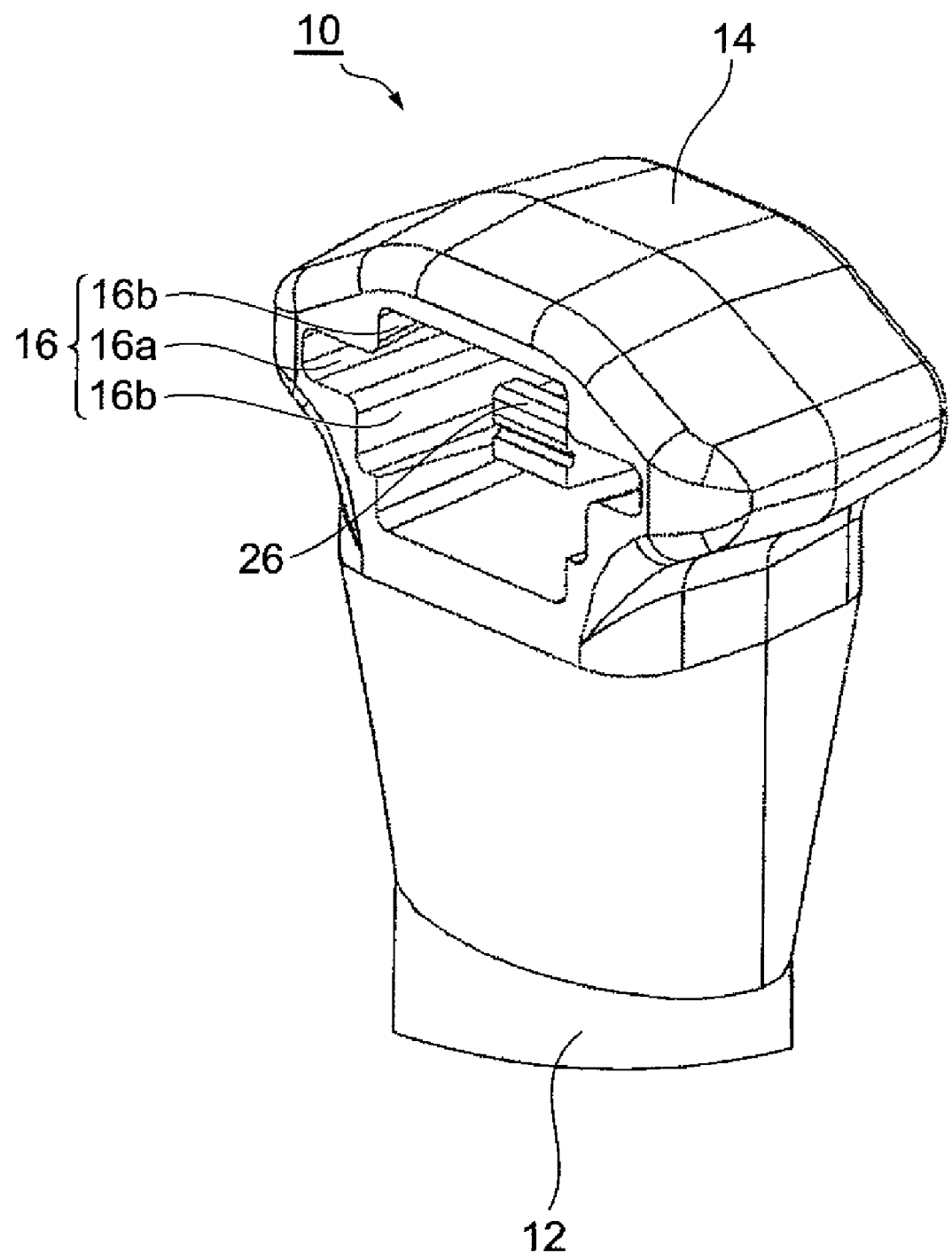
FIG. 5 is a perspective view illustrating in an enlarged manner an engaging portion in FIG. 1.
Figure 6:
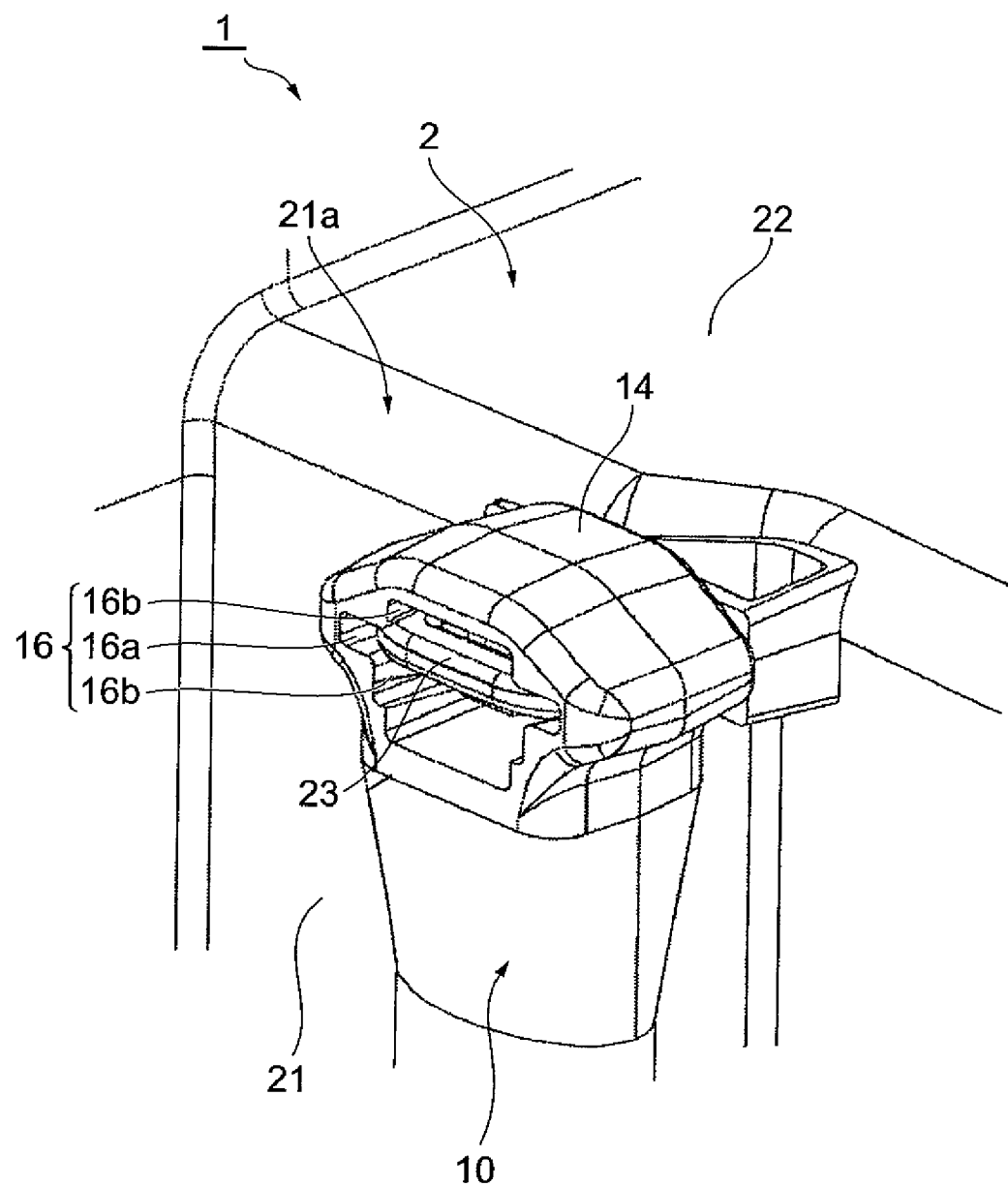
FIG. 6 is a perspective view illustrating an engagement state between the engaging portion and the engaged portion.
Figure 7:
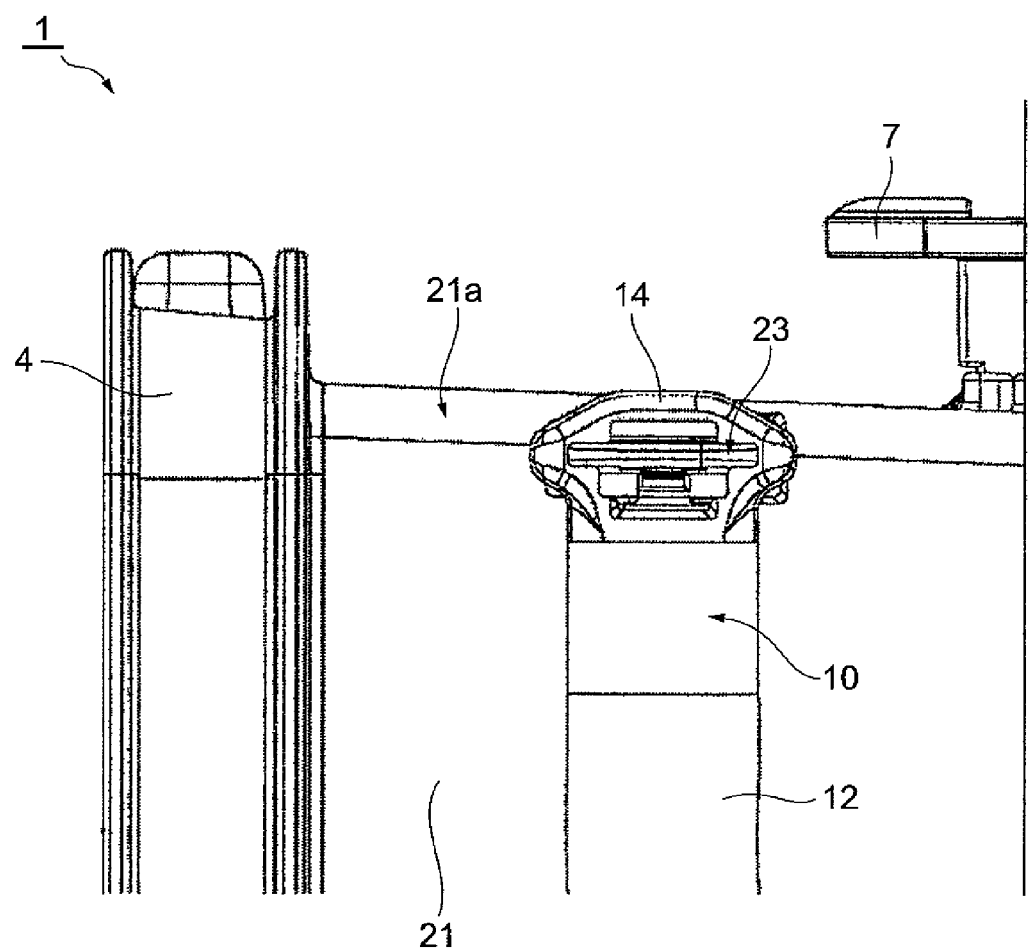
FIG. 7 is a side view illustrating the engagement state between the engaging portion and the engaged portion.

FIG. 5 is a perspective view illustrating in an enlarged manner the engaging portion in FIG. 1. FIGS. 6 to 9 are views of illustrating an engagement state of the engaging portion and the engaged portion. Although in FIGS. 5 to 9, only the engaging portion 14 of the engaging portions 14 and 15 is illustrated, the engaging portion 15 is of the same construction as that of the engaging portion 14. The engaging portions 14 and 15 are formed with an opening 16 in which the engaged portions 23 and 24 are inserted. This opening 16, in a side view, includes a wide portion 16a which size corresponds to that of the engaged portions 23 and 24, and vertically on both sides of this wide portion 16a, a narrow portion 16b which diameter is made smaller than that of the wide portion 16a is formed. Further, the engaged portions 23 and 24 are inserted in the opening 16.

Figure 9:
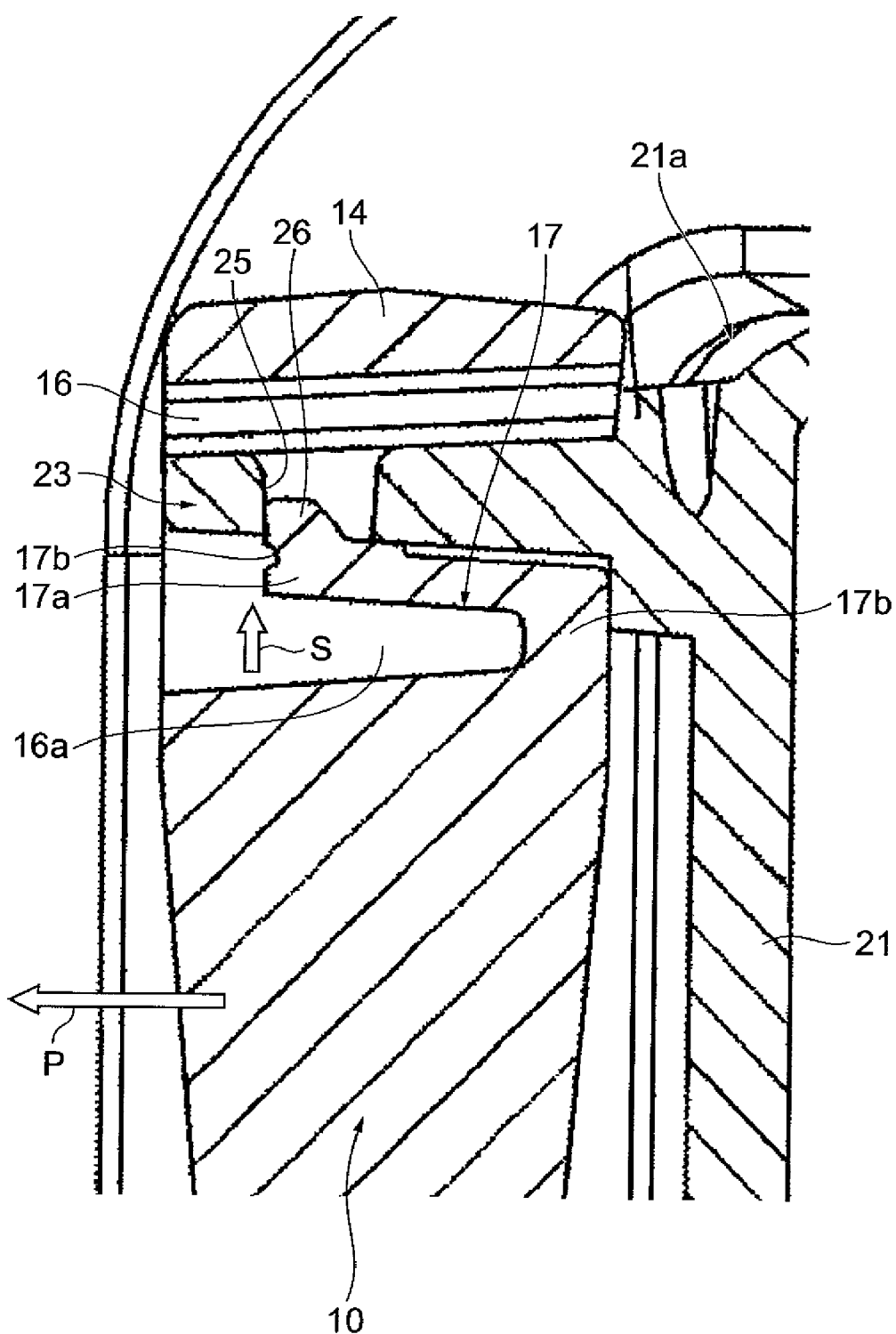
FIG. 9 is a cross sectional view illustrating in an enlarged manner the engagement state between the engaging portion and the engaged portion.

Moreover, the engaging portions 14 and 15, as illustrated in FIGS. 8 and 9, include an elastic piece 17 that is formed in the opening 16. At a distal end portion (at the end portion on the side opposite to the side wall 21) 17a of this elastic piece 17, there is formed an engaging pawl 26 to be engaged with the engaging hole 25 of the engaged portions 23 and 24. A base end portion 17b (end portion on the side of side wall 21) of the elastic piece 17 protrudes from the inner wall surface 16a on the curved side of portion 12 of the opening 16, and bent in a direction opposite to the side wall 21. The elastic piece 17 has elasticity, the engaging pawl 26 that is formed at the distal end portion 17a is engaged so as to be contacted with an inclined surface of the engaging hole 25. The inclined surface of the engaging hole 25, in FIG. 9, is inclined so as to fall outward on the upper portion side. In addition, the engaging pawl 26, in conformity with the inclined surface of the engaging hole 25, is formed with an inclined surface so as to fall outward on the upper portion side.

With the arrangement, due to that the engaging hole 25 and the engaging pawl 26 are formed with the inclined surface, in the engaged state, in the case where an external force P (refer to FIG. 9) in a direction of releasing the handle 10 is exerted, the engaging pawl 26 will move in S direction as illustrated along the inclined surface, thus enabling to effectively prevent the engaging pawl 26 form being released from the engaging hole 25.

Moreover, there is formed at the distal end of the elastic piece 17 an operated portion 17b, being a concave portion that is exposed externally (incidentally, the operated portion may be a convex portion instead of the concave portion). When the handle 10 that is attached to the container main body 2 is removed, the operated portion 17b is pressed down, and the engaging pawl 26 is released from the engaging hole 25, thereby enabling to separate the handle 10 from the container main body 2. For example, a dedicated jig having a tip end to be engaged with the operated portion 17b is prepared, and the handle 10 can be easily removed by using this jig.

Then, when the handle 10 is attached to the container main body 2, the engaging portion 14 is located in the position corresponding to the engaged portion 23 and the engaging portion 15 is located in the position corresponding to the engaged portion 24, to push the handle 10, thereby enabling to easily attach the handle 10 to the container main body 2.

The handle 10, as illustrated in FIG. 3, in the state of being attached to the container main body 2, the longitudinal center 11c of the grip 11 is located further to the side of opening 3 than the center of gravity of the container main body 2. For example, the center 11c of the grip 11 is located with about 10 mm shifted to the side of opening 3 (to the side of lid body 4) from the center 2a of gravity of the container main body 2. Whereby, even if the container main body 2 is lifted in the state in which the lid body 4 is not mounted, the rear side of the container main body 2 is lowered downward and the opening 3 is faced upward, so that the substrate W is prevented from being erroneously sprung out of the container main body 2 through the opening 3.

In such a substrate container 1, the engaged portions 23 and 24, being the positions to which the handle 10 is secured, are provided at the corner portions 21a and 21b of the side wall 21 of the container main body 2. The corner portions 21a and 21b of the side wall 21 of the container main body 2 have a higher rigidity than that of the side wall 21 to be unlikely to deform, so that due to provision of the positions to which the handle 10 is secured at the corner portions 21a and 21b, the possibility of deformation of the container main body 2 is reduced. Therefore, the deformation of the container main body 2 when an operator grips the handle 10 and lifts the container main body 2 is decreased.

With the arrangement, in the substrate container 1, since the deformation of the container main body 2 is reduced, generation of the friction between the container main body 2 and the substrate W that is contained in an internal part thereof can be prevented, and thus generation of particles can be suppressed. Furthermore, since the deformation of the container main body 2 is reduced, the positional accuracy of the substrate W in the container main body 2 comes to be high, and thus the substrate W can be held in the container main body 2 with high positional accuracy. Thus, the substrate W that is contained in the container main body 2 can be taken out with high positional accuracy, and errors when taking out the substrate W can be prevented.

Figure 10:
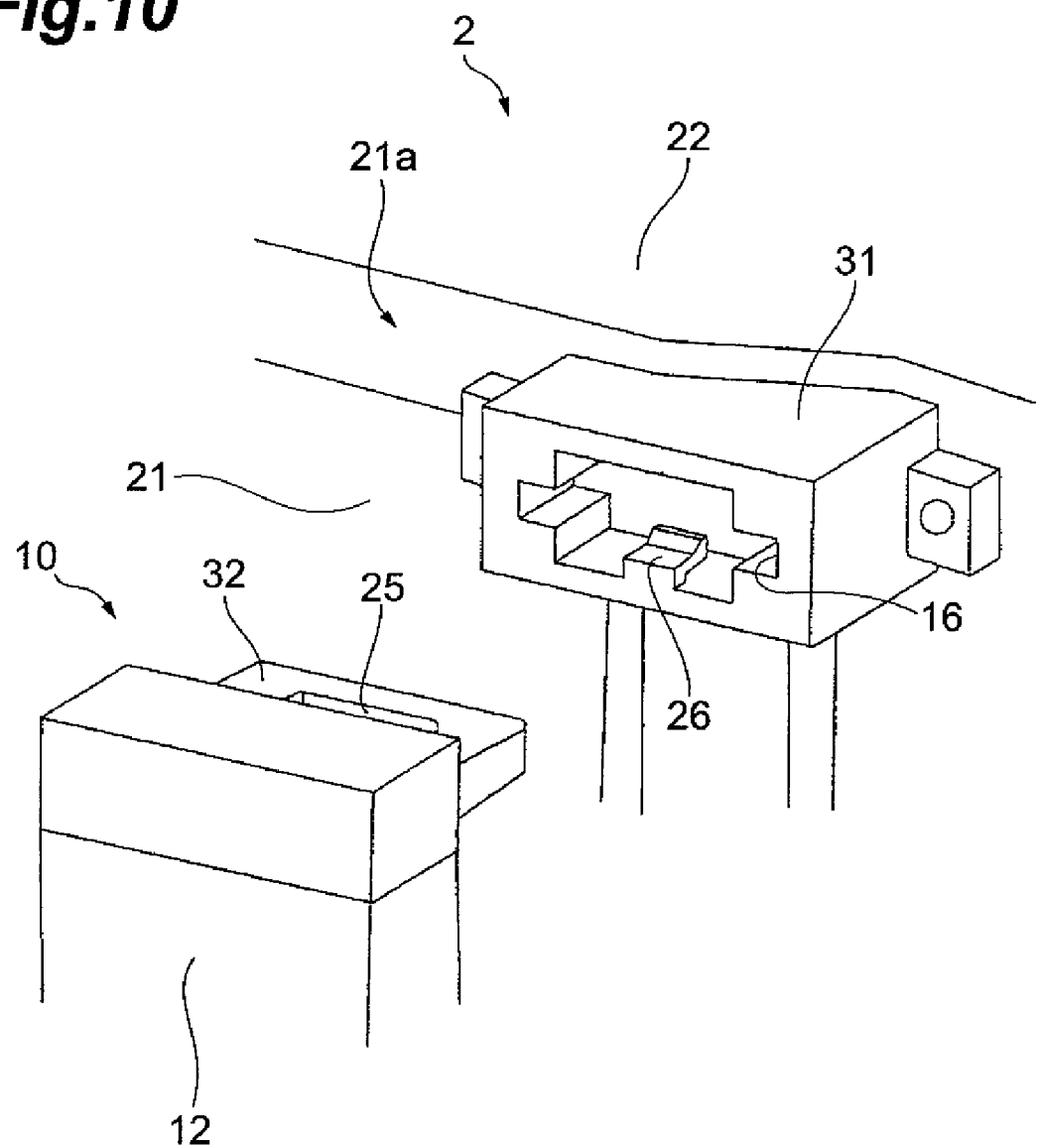
FIG. 10 is an exploded perspective view illustrating another form of an engaging portion and an engaged portion.

Now, another form of an engaging portion and an engaged portion will be described with reference to FIG. 10. FIG. 10 is an exploded perspective view illustrating another form of an engaging portion and an engaged portion. What distinguishes another form illustrated in FIG. 10 from the above-mentioned embodiment is that the container main body 2 is provided with an engaged portion 31 formed with an engaging pawl 26 and the handle 10 is provided with an engaging portion 32 in which an engaging hole 25 is formed. It is preferable to be the engaging portion 31 and the engaged portion 32 in such construction. The handle according to this embodiment may be provided with alternate concave and convex ribs at a part or all over the region, or processed with crimps of patterns such as leather, woven fabrics, wood-grain or grain, thus preventing the adhesion of dirt or providing slip resistance effects.

Heretofore, although the present invention has been specifically described based on the embodiment thereof, the present invention is not limited to the above-mentioned embodiment. Although in the above-mentioned embodiment, the substrate container according to the present invention is described as the one containing a semi-conductor wafer, the substrate to be contained therein is not limited to the semi-conductor wafer, but may be other precision substrates including a mask glass. Furthermore, the size of the substrate to be contained is not limited to 300 mm, but may be other dimensions, for example, 450 mm. Moreover, the number of pieces to be contained is not limited to 1 to 25 pieces, but may be not less than 26 pieces.

In addition, the shape of the handle is not limited to that in the above-mentioned embodiment, but the shape thereof may be an arbitrary shape. The positions to which the handle is secured have only to be located at the opposed edge portions of the side wall.

Figure 11:
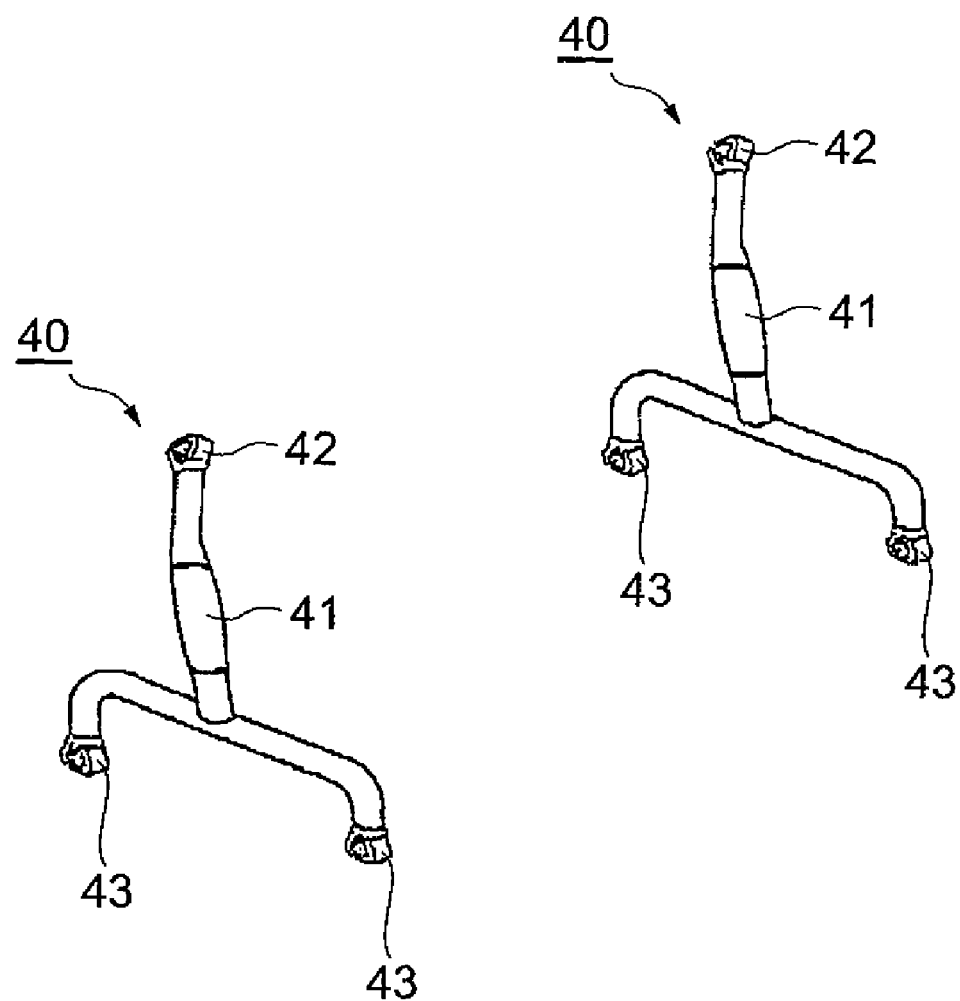
FIG. 11 is a perspective view illustrating another embodiment of a handle according to the present invention.

FIG. 11 is a perspective view illustrating another embodiment of a handle according to the present invention. A handle 40 illustrated in FIG. 11 is formed to be of inverted Y shape in a side view, and includes a grip 41 extending vertically. Furthermore, the portions (engaging portions) 42 and 43 to be secured to the ridge portions (corner portions) of the container main body 2 are formed at one point (42) on the top plate side and at two points (43) on the bottom plate side, to be totally at three points. The securing method may be the same engagement structure as that of the above-mentioned embodiment, but may be the one of using another engagement structure in combination. Due to that the handle 40 is secure at not less than three points in such a way, the torsion or the flexion of the handle 40 to be secured to the container main body can be prevented. As a result, the substrate container can be held with high stability when an operator lifts up the substrate container.

In addition, although in the above-mentioned embodiment, the longitudinal direction of the grip is located to be inclined vertically, the longitudinal direction of the grip may not be inclined. For example, the grip portion may be formed to be of a circular shape or of a polygon shape and formed with concavities and convexities in which fingers can be put in on the surface, or the grip portion may be parallel to the bottom plate of the container or perpendicular thereto.

Moreover, although in the above-mentioned embodiment, the handle is constructed to be detachable with respect to the container main body 2, the handle may be fixed so as to be incapable of being removed from the container main body.

Furthermore, although in the above-mentioned embodiment, the longitudinal center of the grip, in a plan view, is located further to the front than the center of gravity of the container main body 2, the longitudinal center of the grip may be located in the same position as the center of gravity of the container main body 2 or located further to the rear than the center of gravity of the container main body 2. Incidentally, to make the opening 3 likely to face upward when the grip is gripped and the container main body 2 is lifted up, as is the above-mentioned embodiment, preferably, the longitudinal direction of the grip is made to be inclined, as well as the center of the grip is located further to the front than the center of gravity of the container main body 2.

Incidentally, the grip may not be gripped by an operator. For example, the grip may be gripped by a robot or other machines, and thus the container main body may be lifted.

Furthermore, although in the above-mentioned embodiment, the handle is attached to the container main body of front-open type, the handle may be attached to, for example, the one of the top-open type in which an opening is formed in the tope plate of the container main body.

Figure 12:
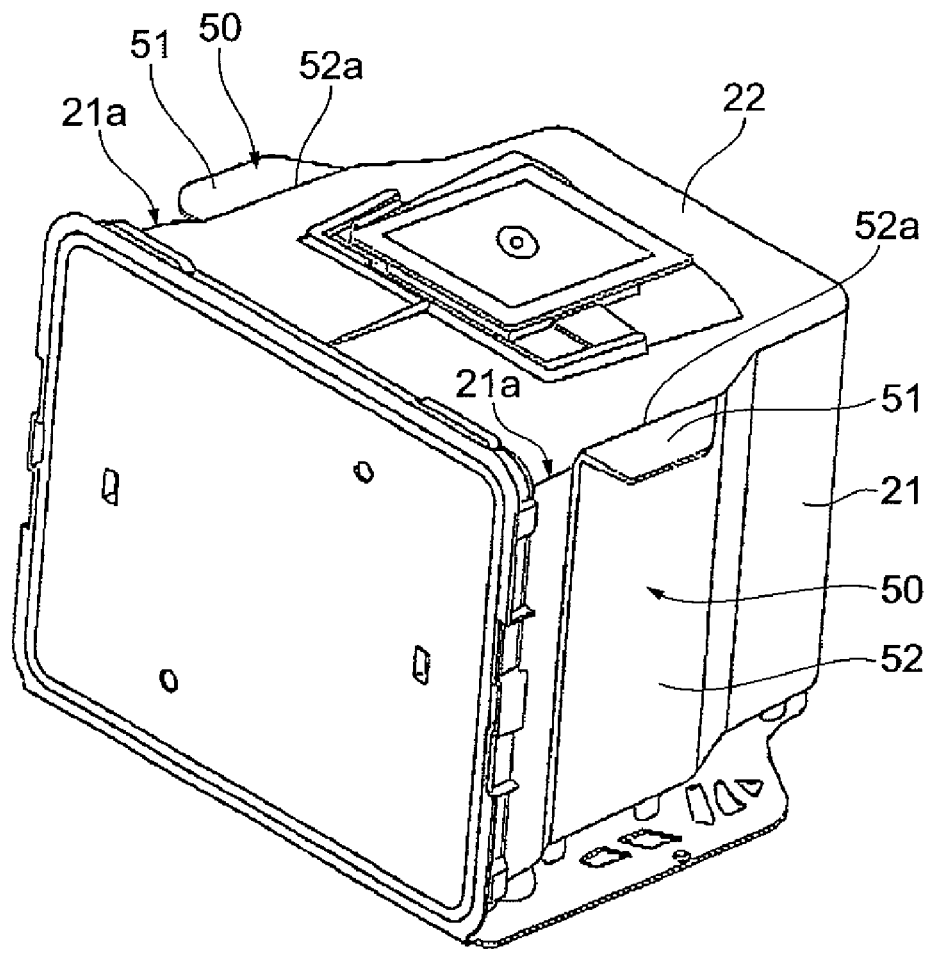
FIG. 12 is a perspective view illustrating a substrate container provided with a handle of yet another form.

FIG. 12 is a perspective view illustrating a substrate container provided with a handle of yet another form. In a handle 50 of this another form, from a ridge portion (corner portion) 21a on the side of top plate 22 of the container main body 2, a grip portion 51 that protrudes outward from the side wall 21 is formed integrally with the container main body 2.

This handle 50 includes a plate portion 52 that is fixed to the external surface of the side wall 21 of the container main body 2. The grip portion 51 is bent at an upper end portion 52a of the plate portion 52 to be protruded outward. The upper end portion 52a of the plate portion 52 is fixed along the ridge portion 21a on the side of top plate 22 of the container main body 2, and the grip portion 51 is protruded outward from the ridge portion 21a. With the arrangement, the grip portion 51 of the handle 50 is protruded outward from the ridge portion 21a of the side wall 21, so that the structure of the handle 50 can be made simple, as well as the deformation of the container main body 2 on the occasion of gripping the handle 50 to hold the container main body 2 can be decreased.

While the invention has been particularly shown and described, it is to be understood that various changes and modifications may be made in the invention. It will be understood by those skilled in the art that the foregoing and other change in form and details can be made therein without departing from the spirit and scope of the invention as set forth in the appended claims.

What is claimed is:

1. A substrate container comprising:
   a container main body including an opening and containing a substrate;
   a lid body closing the opening; and
   a pair of handles provided on a pair of opposing side walls of the container main body,
   wherein each of the handles is secured to an end portion of the side wall on which the handle is provided,
   wherein each of the handles is generally rod shaped, which is at least in part curved and at least in part protruded from the side wall on which the handle is provided,
   wherein, for each of the handles, ends of the handle are connected to diagonally opposite corners, respectively, on the side wall on which the handle is provided, and
   wherein each of the handles continuously extends along a diagonal direction from one to the other corner of the side wall on which the handle is provided; wherein the handle includes: a grip to be gripped by an operator; and engaging portions formed continuously from both end portions of the grips, and which are engaged with an engaged portion formed at an edge portion opposed to each other on the side walls; wherein a longitudinal center of the grip is located further to the opening side from the center of gravity of the container main body.

2. The substrate container according to claim 1, wherein the engaging portion is provided with an engaging pawl, and the engaged portion is formed with an engaging hole with which the engaging pawl is engaged.

3. The substrate container according to claim 1, wherein the engaged portion is provided with an engaging pawl, and the engaging portion is formed with an engaging hole with which the engaging pawl is engaged.

4. A pair of handles of a substrate container, each of which is attached to a side wall of a container main body of a substrate container including an opening and containing a substrate, each of the handles comprising:
   a grip to be gripped by an operator; and
   an engaging portion which is connected to both end portions of the grip, and which are engaged with an engaged portion formed at edge portions opposed to each other on the side wall, and
   wherein the each handle is generally rod shaped, which is at least in part curved and at least in part protruded from the side wall on which the handle is provided,
   wherein ends of the each handle are connected to diagonally opposite corners, respectively, on the side wall on which the handle is provided, and
   wherein the each handle continuously extends along a diagonal direction from one to the other corner of the side wall on which the handle is provided; wherein a longitudinal center of the grip is located further to the opening side from the center of gravity of the container main body.

* * * * *